United States Patent
Morita et al.

(10) Patent No.: US 7,463,119 B2
(45) Date of Patent: Dec. 9, 2008

(54) SURFACE ACOUSTIC WAVE DEVICE

(75) Inventors: Takao Morita, Tatsuno-machi (JP); Takuya Owaki, Minowa-machi (JP)

(73) Assignee: Epson Toyocom Corporation, Kawasaki (JP)

( * ) Notice: Subject to any disclaimer, the term of this patent is extended or adjusted under 35 U.S.C. 154(b) by 0 days.

(21) Appl. No.: 11/319,404

(22) Filed: Dec. 29, 2005

(65) Prior Publication Data

US 2006/0145569 A1 Jul. 6, 2006

(30) Foreign Application Priority Data

Jan. 6, 2005 (JP) ............................. 2005-001052

(51) Int. Cl.
*H03H 9/25* (2006.01)
*H01L 41/08* (2006.01)

(52) U.S. Cl. .................... 333/193; 310/313 A; 310/361

(58) Field of Classification Search ......... 333/193–196; 310/313 A–313 D, 361
See application file for complete search history.

(56) References Cited

U.S. PATENT DOCUMENTS

| | | | |
|---|---|---|---|
| 4,159,435 A | | 6/1979 | Lewis |
| RE35,204 E | * | 4/1996 | Lewis ..................... 310/313 A |
| 6,154,105 A | * | 11/2000 | Fujimoto et al. ............ 333/194 |
| 6,172,582 B1 | * | 1/2001 | Hickernell ................... 333/195 |
| 6,218,763 B1 | * | 4/2001 | Fujimoto et al. ........ 310/313 R |
| 6,437,668 B1 | * | 8/2002 | Nakao et al. ................. 333/193 |
| 6,865,786 B2 | * | 3/2005 | Nakao et al. ................ 29/25.35 |
| 6,879,225 B2 | * | 4/2005 | Kadota et al. ............... 333/193 |

FOREIGN PATENT DOCUMENTS

| | | | |
|---|---|---|---|
| EP | 860943 A2 | * | 8/1998 |
| EP | 0 936 733 A2 | | 8/1999 |
| JP | A 53-105394 | | 9/1978 |
| JP | A 55-045284 | | 3/1980 |
| JP | A 58-033309 | | 2/1983 |
| JP | A 07-046079 | | 2/1995 |
| JP | B2-3353742 | | 9/2002 |
| JP | A 2004-007846 | | 1/2004 |
| WO | WO 2005/099089 | | 10/2005 |

OTHER PUBLICATIONS

Josse, Temperature Dependence of SH-Wave on Rotated Y-Cut Quartz with SiO2 Overlay, IEEE Trans. on Sonics and Ultrasonics, vol. SU-31, No. 3, pp. 162-168, May 1984.*
Kadota et al.; "Small-Sized Resonator IF Filter Using Shear Horizontal Wave on Heavy Metal Film/Quartz Substrate;" 2002 IEEE International Frequency Control Symposium and PDA Exhibition; pp. 50-54, 2002.
"Surface Skimming Bulk Waves," Meirion Lewis, Royal Signals and Radar Establishment, Malvern, Worcs, U.K., pp. 744-752, 1977 Ultrasonics Symposium Proceedings, 1977.

* cited by examiner

Primary Examiner—Seungsook Ham
(74) Attorney, Agent, or Firm—Oliff & Berridge, PLC

(57) ABSTRACT

A surface acoustic wave device has a piezoelectric substrate and an IDT formed on the piezoelectric substrate, and uses an excited wave as an SH wave. The piezoelectric substrate is a quartz plate in which a cut angle θ of a rotated Y-cut quartz substrate is set in the range of $-65° \leq \theta \leq -51°$ in a counterclockwise direction from a crystal Z-axis and the propagation direction of a surface acoustic wave is set in the range (90°±5°) with respect to a crystal X-axis. The IDT is made of Ta or an alloyed metal containing Ta as the main component.

7 Claims, 5 Drawing Sheets

SURFACE ACOUSTIC WAVE DEVICE

BACKGROUND

1. Technical Field

The present invention relates to a surface acoustic wave device using a quartz substrate and, in particular, to a surface acoustic wave device which can achieve excellent frequency temperature characteristic of a broadband.

2. Related Art

In recent years, a surface acoustic wave (hereinafter, referred to as SAW) device has been widely used in mobile communication terminal or other apparatuses for a vehicle. In particular, a surface acoustic wave device is required to have excellent frequency temperature characteristic of a broadband.

An SAW device, using an ST cut quartz substrate as an SAW device according to the related art, has been proposed. The ST cut quartz substrate is a cut name of a quartz substrate having a plane (XZ' plane) which is rotated in the counter-clockwise direction from an XZ plane about a crystal X-axis by 42.75° from a crystal Z-axis, and uses an SAW (hereinafter, referred to as "ST cut quartz SAW") that is a (P+SV) wave called a Rayleigh wave which propagates in the crystal X-axis direction. The ST cut quartz SAW device has been widely used for an SAW resonator functioning as an oscillation element, and for an IF filter disposed between an RF stage and an IC of a mobile communication terminal. FIG. 6 is a view showing the configuration of the ST cut quartz SAW resonator, in which a comb-type electrode (hereinafter, referred to as "IDT") 102 having a plurality of electrode fingers alternately inserted therein is disposed on an ST cut quartz substrate 101, and grating reflectors 103a and 103b for reflecting an SAW are dispose at both sides of the IDT 102. The electrodes of the IDT 102 and the grating reflectors 103a and 103b each are made of Al or an alloyed metal containing Al as the main component.

In the ST cut quartz SAW device, a first-order temperature coefficient of the frequency temperature characteristic is zero, and the characteristic is indicated by a second-order curve. When the turnover temperature is set to the middle of the available temperature range, the amount of frequency variation remarkably decreases. Accordingly, it is well known that frequency stability is excellent.

However, in the above-described ST cut quartz SAW device, even though the first-order temperature coefficient is zero, a second-order temperature coefficient is relatively high $-3.4(10^{-8}/° C.^2)$. Therefore, if the available temperature range is expanded, a problem occurs in which the amount of frequency variation sharply increases. In addition, since the electromechanical coupling coefficient $k^2$ of the ST cut quartz SAW device is small, it is difficult to achieve characteristics of a broadband when a filter is provided.

When a piezoelectric substrate having a large electromechanical coupling coefficient $k^2$, like that of $Li_2B_4O_7$, is used in order to widen the band, the frequency temperature characteristic deteriorate, and the margin should be sufficiently ensured for security standards such as insertion loss in the operation temperature range and attenuation amount in the vicinity of a passing band, such that the manufacturing yield deteriorates.

In contrary, in Japanese Patent No. 3353742 and in Michio Kadota, "Small-sized resonator IF filter using shear horizontal wave on heavy metal film/quartz substrate", IEEE International Frequency Control Symp. Proc., pp. 50 to 54(2002), by using an SH wave which propagates in a direction rotated in a 90° plane with respect to the propagation direction of the ST cut quartz SAW, or by using materials, having a heavier gravity than that of the piezoelectric substrate, such as W, Ta to form electrodes, an electromechanical coupling coefficient larger than that of the ST cut quartz SAW is obtained. Therefore, characteristics of a broadband can be achieved when a filter is provided.

However, in the SAW device disclosed in Japanese Patent No. 3353742 or in Michio Kadota, "Small-sized resonator IF filter using shear horizontal wave on heavy metal film/quartz substrate", IEEE International Frequency Control Symp. Proc., pp. 50 to 54(2002), characteristics of a broadband can be achieved easier than in the ST cut quartz SAW device. On the other hand, a second-order temperature coefficient of the frequency temperature characteristic is substantially equal to that of the ST cut quartz SAW device, and the problem still remains in which the amount of frequency variation sharply increases when the available temperature range is expanded.

SUMMARY

An advantage of some aspects of the invention is that it provides an SAW device which uses a quartz substrate as a piezoelectric substrate and an SH wave and can achieve excellent frequency temperature characteristic of a broadband.

According to a first aspect of the invention, a surface acoustic wave device includes a piezoelectric substrate and an IDT formed on the piezoelectric substrate and uses an excited wave as an SH wave. In this case, the piezoelectric substrate is a quartz plate in which a cut angle θ of a rotated Y-cut quartz substrate is set in the range of $-65°≦θ≦-51°$ in a counterclockwise direction from a crystal Z-axis and the propagation direction of a surface acoustic wave is set in the range (90°±5°) with respect to a crystal X-axis. The IDT is made of Ta or an alloyed metal containing Ta as the main component.

In the surface acoustic wave device, preferably, an electrode thickness H/λ, standardized by a wavelength of the IDT, is set in the range of H/λ≧0.01 when a wavelength of an excited surface acoustic wave is set to be λ.

Further, in the surface acoustic wave device, preferably, the multiplication H/λ·mr of the electrode thickness H/λ and metallization ratio mr is set in the range of 0.004≦H/λ·mr<0.019, when a metallization ratio mr of the electrode fingers of the IDT is represented by (electrode finger widths)/(electrode finger widths+spaces between electrode fingers).

Furthermore, according to a second aspect, a complex device is provide which uses the surface acoustic wave device according to the first aspect and includes an oscillation circuit and a module device.

According to the first aspect of the invention, a surface acoustic wave device includes a piezoelectric substrate and an IDT formed on the piezoelectric substrate and uses an excited wave as an SH wave. In this case, the piezoelectric substrate is a quartz plate in which a cut angle θ of a rotated Y-cut quartz substrate is set in the range of $-65°≦θ≦-51°$ in a counterclockwise direction from a crystal Z-axis and the propagation direction of a surface acoustic wave is set in the range (90°±5°) with respect to a crystal X-axis. The IDT is made of Ta or an alloyed metal containing Ta as the main component. Therefore, excellent frequency temperature characteristic of a broadband can be achieved.

In the surface acoustic wave device, the electrode thickness H/λ, standardized by a wavelength of the IDT, is set in the range of H/λ≧0.01 when the wavelength of the excited surface acoustic wave is set to be λ. Therefore, the electromechanical coupling coefficient $k^2$ can be made larger than that in the related art in which Al film is formed on the ST cut quartz substrate, such that characteristics of a broadband can be achieved.

Further, in the surface acoustic wave device, the multiplication $H/\lambda \cdot mr$ of the electrode thickness $H/\lambda$ and metallization ratio mr is set in the range of $0.004 \leq H/\lambda \cdot mr \leq 0.019$, when the metallization ratio mr of the electrode fingers of the IDT is represented by (electrode finger widths)/(electrode finger widths+spaces between electrode fingers). Therefore, a second-order temperature coefficient can be made smaller than that in the related art, and the turnover temperature can be easily set around room temperature.

Furthermore, according to the second aspect, the surface acoustic wave device is used for a complex device such as an oscillation circuit and a module device. Therefore, a module device or an oscillation with high-performance can be provided.

BRIEF DESCRIPTION OF THE DRAWINGS

The invention will be described with reference to the accompanying drawings, wherein like numbers reference like elements.

FIG. 1A is a plan view, FIG. 1B is an explanatory view showing the cut angle of a piezoelectric substrate, and FIG. 1C is a cross-sectional view of an IDT.

DESCRIPTION OF EXEMPLARY EMBODIMENTS

Figure 1A:
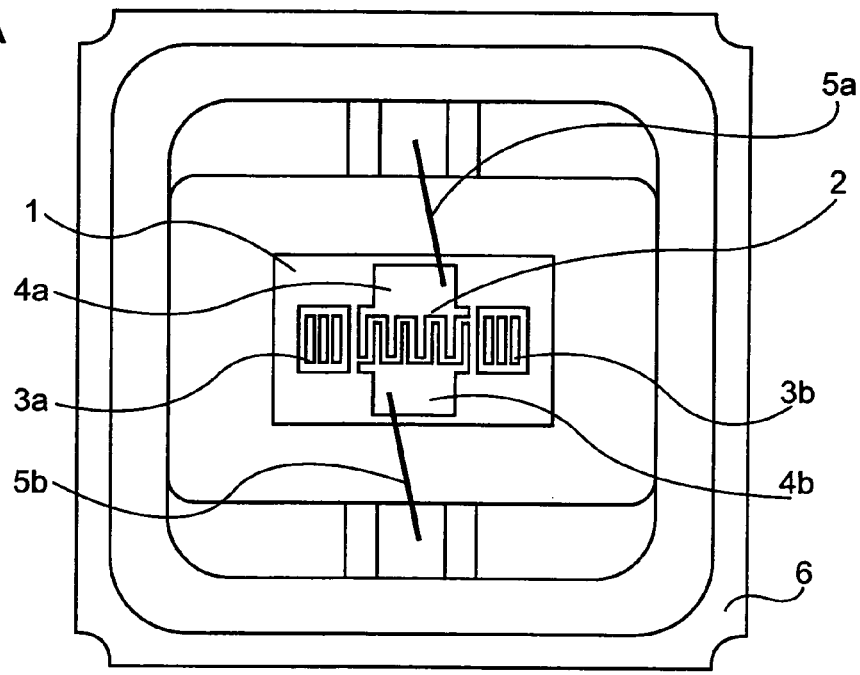
FIGS. 1A to 1C are explanatory views showing an SAW resonator of the invention.
Figure 1B:
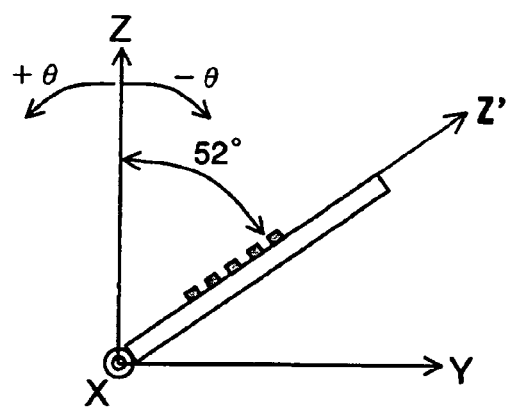
Figure 1C:
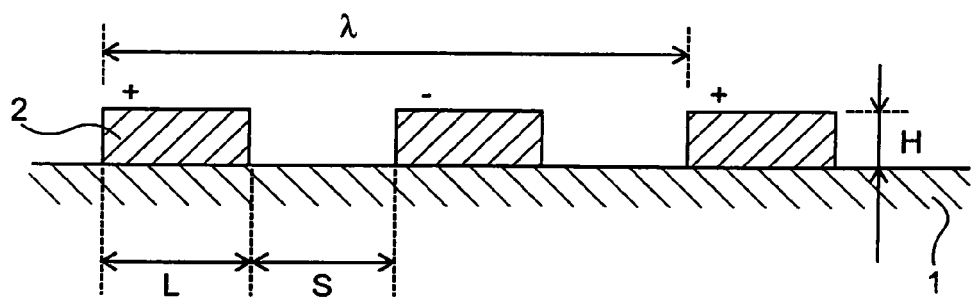

Hereinafter, a preferred embodiment of the invention will be described in detail with reference to the accompanying drawings. FIG. 1A is a plan view of an SAW resonator according to the invention. The SAW resonator has a structure in which an IDT 2, constructed with positive electrode fingers and nagative electrode fingers that are alternately inserted therein, and grating reflectors 3a and 3b for reflecting a surface acoustic wave by both sides of the IDT 2, on a piezoelectric substrate 1. Input/output pads 4a and 4b of the IDT 2 are electrically connected to input/output terminals of a package 6 by metal wires 5a and 5b, and an opening of the package 6 is air-tightly sealed by a lid. As shown in FIG. 1B, the piezoelectric substrate 1 is a quartz plate in which a cut angle θ of a rotated Y-cut quartz substrate is set to a position that is rotated in counter-clockwise direction by −52° from a crystal Z-axis, and in which a propagation direction of the SAW is set in a Z'-axis direction substantially perpendicular (90°±5°) to a crystal X-axis, and an excited SAW is an SH wave. Further, the above-described cut angle is represented by an Euler angle (0°, 38°, 90°±5°). Furthermore, the electrodes of the IDT 2 and the grating reflectors 3a and 3b each are made of Ta or an alloyed metal containing Ta as the main component. FIG. 1C is a cross-sectional view of the IDT 2. In an embodiment to be described below, when a wavelength of SAW excited on the IDT 2 is set to be λ, the electrode thickness is represented by $H/\lambda$, that is, a value obtained by standardizing the thickness by the wavelength λ. A metallization ratio mr is represented by (electrode finger widths L)/(electrode finger widths L +spaces S between electrode fingers).

Figure 2:
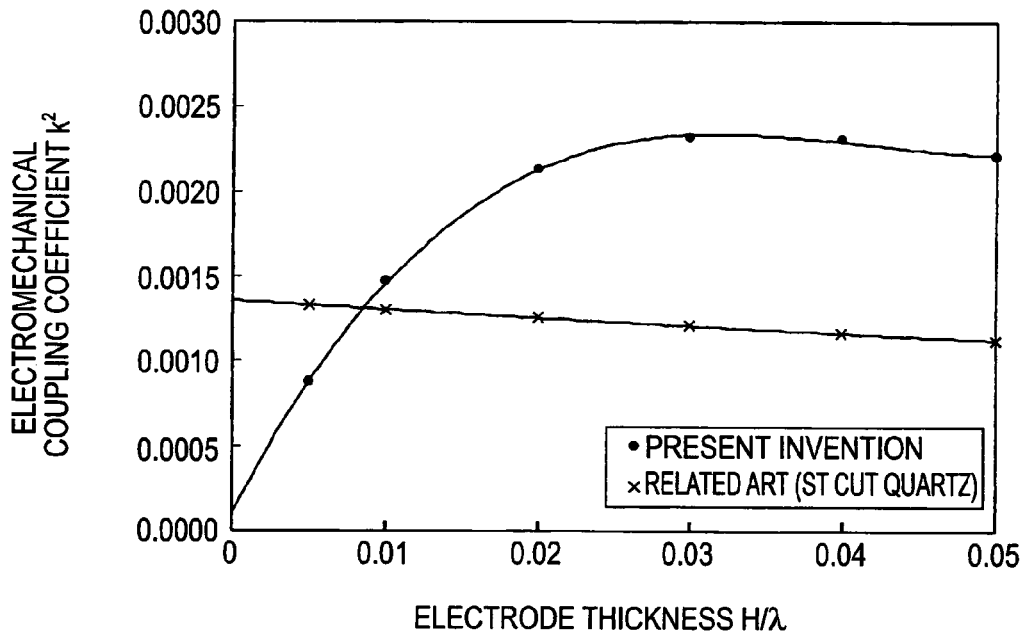
FIG. 2 is a graph showing the relationship between the electrode thickness $H/\lambda$ and the electromechanical coupling coefficient $k^2$ of the SAW resonator of the invention and of the related art.

First, the relationship between the electrode thickness $H/\lambda$ an electromechanical coupling coefficient $k^2$ in the SAW device according to the invention has been studied. FIG. 2 is a graph showing the comparison of an electromechanical coupling coefficient $k^2$ between the case, in which a Ta film is formed on the quartz plate in which the cut angle θ in the invention is set in the vicinity of −52° and the propagation direction of the SAW is set substantially perpendicular to the crystal X-axis, and the case, in which an Al film is formed on an ST cut quartz substrate according to the related art. As shown in FIG. 2, in the case in which an Al film is formed on the ST cut quartz substrate according to the related art, as the electrode thickness $H/\lambda$ increases, the electromechanical coupling coefficient $k^2$ monotonically decreases, and the maximum value of $k^2$ is 0.0014 at the most. In contrary, in the invention, as the electrode thickness $H/\lambda$ increases, $K^2$ sharply increases, so that $k^2$ is larger than that in the related art when $H/\lambda \geq 0.01$.

Figure 3:
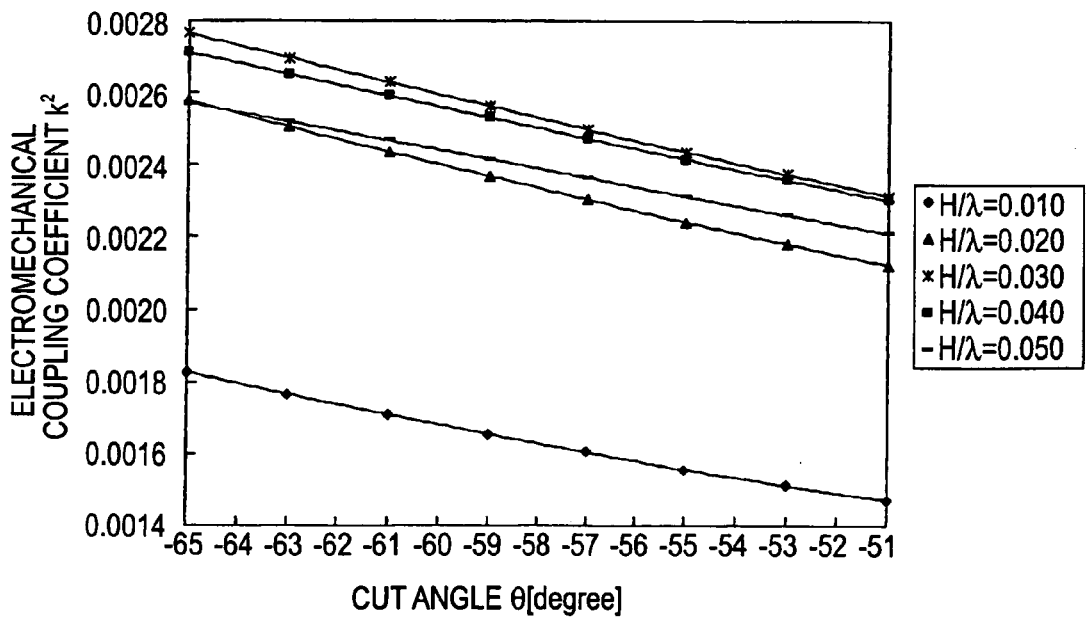
FIG. 3 is a graph showing the relationship between the cut angle θ and the electromechanical coupling coefficient $k^2$, when the electrode thickness $H/\lambda$ is set in the range of 0.01 to 0.05.

FIG. 3 is a graph showing the relationship between the cut angle θ and the electromechanical coupling coefficient $k^2$, and showing the electromechanical coupling coefficient $k^2$ when the cut angle θ is set in the range of −65° to −51° and the electrode thickness $H/\lambda$ is varied in the range of 0.01 to 0.05. As shown in FIG. 3, by setting the cut angle θ in the range of $-65° \leq \theta \leq -51°$ and the electrode thickness $H/\lambda$ in the range of $0.01 \leq H/\lambda \leq 0.05$, the electromechanical coupling coefficient $k^2$ can be made larger, compared with the case in which an Al film is formed on the ST cut quartz substrate according to the related art.

As described above, the quartz substrate is used in which the cut angle θ is set in the range of $-65° \leq \theta \leq -51°$ and the propagation direction of SAW is set substantially perpendicular to the crystal X-axis, electrodes are composed of Ta films on the quartz substrate, and the $H/\lambda$ is set in the range of $0.01 \leq H/\lambda$, preferably, in the range of $0.01 \leq H/\lambda \leq 0.05$. Therefore, the electromechanical coupling coefficient $k^2$ is made larger than that in the related art in which Al film is formed on the ST cut quartz substrate, such that characteristics of a broadband can be achieved when a filter is provided.

Figure 4:
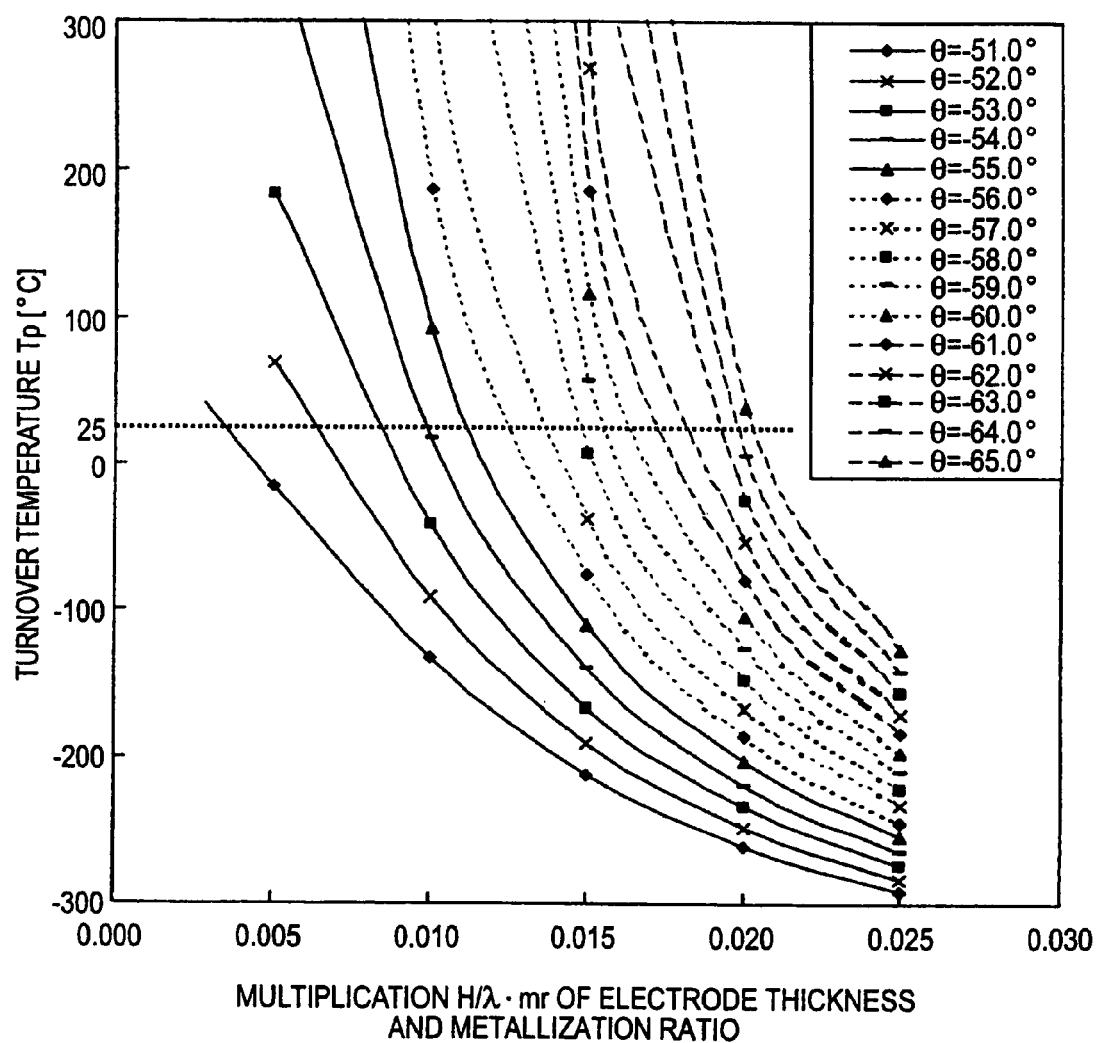
FIG. 4 is a graph showing the relationship between the multiplication $H/\lambda \cdot mr$ of the electrode thickness and the metallization ratio, and the turnover temperature Tp, when the cut angle θ of the SAW resonator of the invention is set in the range of $-65° \leq \theta \leq -51°$.

Next, the frequency temperature characteristic of the SAW device of the invention has been studied. FIG. 4 is a graph showing the relationship between the multiplication $H/\lambda \cdot mr$ of the electrode thickness and the metallization ratio, and the turnover temperature Tp, obtained by calculation when the cut angle θ is set in the range of $-65° \leq \theta \leq -51°$. FIG. 4 shows that the turnover temperature Tp can be set around room temperature 25° C. when the cut angle θ is set in the range of $-65° \leq \theta \leq -51°$ and the multiplication $H/\lambda \cdot mr$ of the electrode thickness and the metallization ratio is set in the range of $0.004 \leq H/\lambda \cdot mr \leq 0.021$. Here, when the electrode thickness $H/\lambda$ is set in the range of $H/\lambda \geq 0.01$, the electromechanical coupling coefficient $k^2$ can be made larger than that in the related art, such that the characteristics of a broadband can be achieved when a filter is provided. When the cut angle θ is set more than −51°, the turnover temperature Tp cannot be set around room temperature. On the other hand, when the cut angle θ is set less than −65°, the sensitivity of the turnover temperature Tp with respect to the electrode thickness H/λ remarkably increases, so that it is very hard to control the turnover temperature. Therefore, it is not proper to set the cut angle θ in the range of θ>−51° and θ<−65° in terms of practical aspects.

Figure 5:
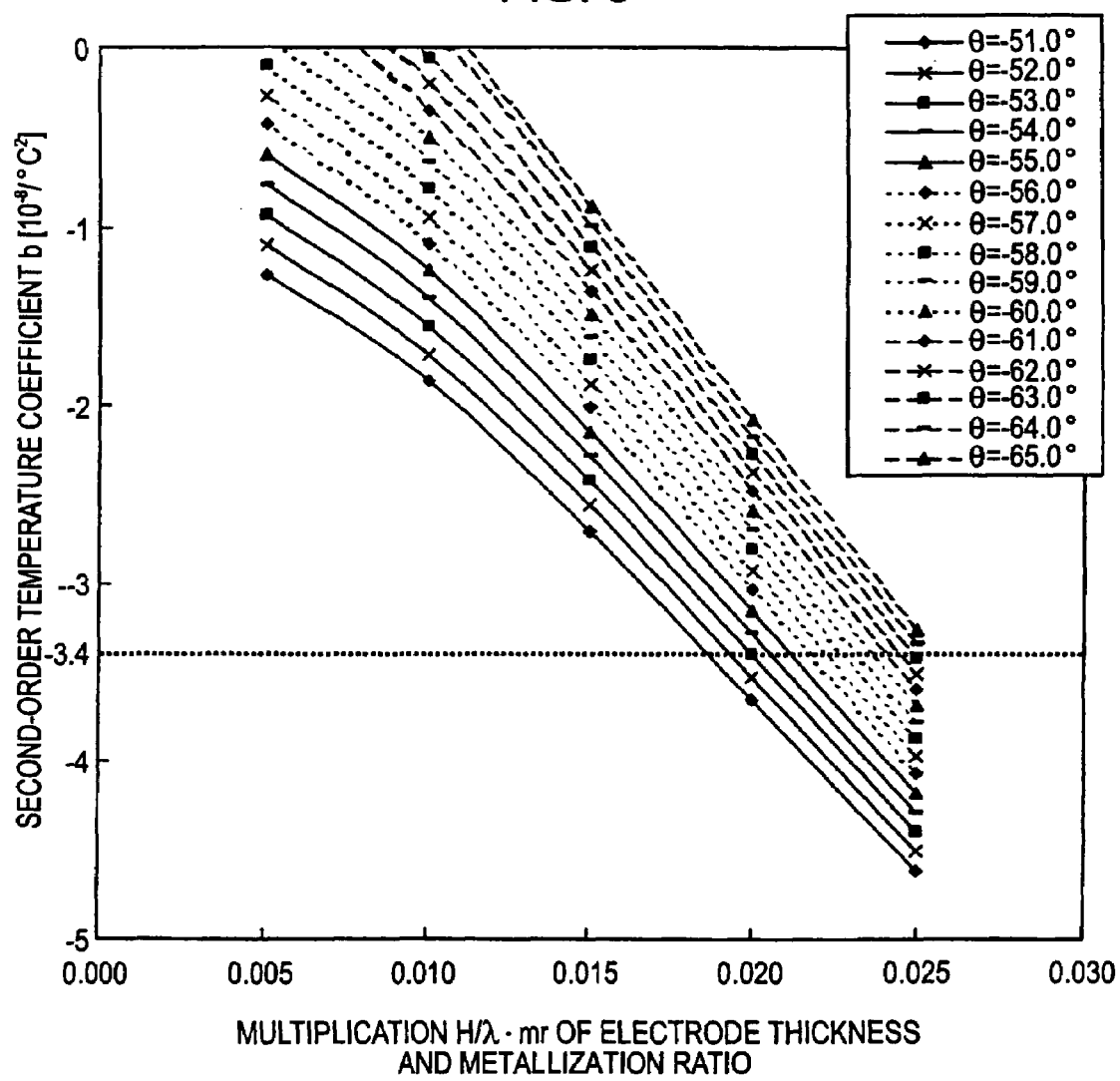
FIG. 5 is a graph showing the relationship between the multiplication $H/\lambda \cdot mr$ of the electrode thickness and the metallization ratio, and a second-order temperature coefficient b, when the cut angle θ is set in the range of $-65° \leq \theta \leq -51°$.
Figure 6:
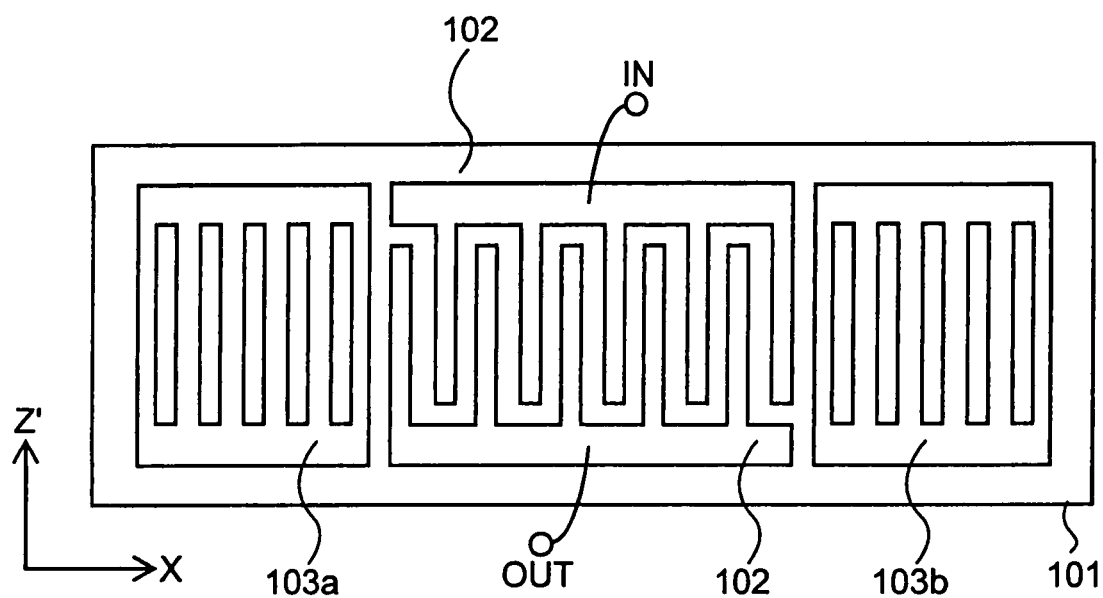
FIG. 6 is an explanatory view showing an SAW device using an ST cut quartz substrate according to the related art.

FIG. 5 is a graph showing the relationship between the multiplication H/λ·mr of the electrode thickness and the metallization ratio, and a second-order temperature coefficient b, obtained by calculation when the cut angle θ of the SAW device according to the invention is set in the range of −65°≦θ≦−51°. In FIG. 5, when the cut angle θ is set in the range of −65°≦θ≦−51°, by setting the multiplication H/λ·mr of the electrode thickness and the metallization ratio in the range of H/λ·mr<0.019, the second-order temperature coefficient b can be set less than the second-order temperature coefficient b =−3.4($10^{-8}$/° $C.^2$) of the ST cut quartz device according to the related art or the SAW device disclosed in Japanese Patent No. 3353742 or in Michio Kadota, "Small-sized resonator IF filter using shear horizontal wave on heavy metal film/quartz substrate", IEEE International Frequency Control Symp. Proc., pp. 50 to 54(2002).

As described above, in the SAW device in which the electrodes are formed of Ta films on a rotated Y-cut quartz substrate in which the cut angle θ is set in the range of −65°≦θ≦−51° and the propagation direction of the SAW is rotated by about 90° with respect to the crystal X-axis, the turnover temperature can be easily set around room temperature by setting the multiplication H/λ·mr of the electrode thickness and the metallization ratio in the range of 0.004≦H/λ·mr≦0.021. Further, by setting the multiplication in the range of H/λ·mr<0.019, the second-order temperature coefficient can be made smaller than that in the related art. Furthermore, when the multiplication H/λ·mr of the electrode thickness and the metallization ratio is set in the range of 0.004≦H/λ·mr<0.019, the turnover temperature can be easily set around room temperature, and the second-order temperature coefficient can be made smaller than that in the related art.

Hereinabove, only the SAW resonator of one port as shown in FIG. 1 has been described. However, the same effects can be obtained when the invention is applied to various types of SAW devices such as the SAW resonator of two ports, a double mode SAW (DMS) filter using sound combination of the SAW resonator, a ladder type SAW filter in which SAW resonators are disposed in a ladder shape in series and parallel arms, and a transversal SAW filter in which an input IDT and an output IDT are disposed at a predetermined interval.

Further, even though the electrodes each have been made of Ta or an alloyed metal containing Ta as the main component, the materials of the electrodes are not limited thereto, and it is clear that the same effects can be obtained when the electrodes are made of materials heavier than Al such as W, Ag, and Au, or alloyed metals containing the heavier materials.

Furthermore, in the above-described SAW device, it is clear that the same effects of the invention can be achieved even when a protective film is formed of $SiO_2$ on the IDT or the grating reflector, or when other metal film is formed on an upper portion of the electrode or on a lower portion of the electrode for the purpose of a contact layer and the improvement of power withstanding performance. Further, the SAW device of the invention can be applied to a sensor device, a module device, and an oscillation circuit, etc. Furthermore, when the SAW device of the invention is used in a voltage control SAW oscillator (VCSO) or the like, the capacity ratio γ can be made small, so that a frequency variable width can be extended.

Besides the structure in which the SAW chip is wire-boned to the package, as shown in FIG. 1, the SAW device of the invention may have other structures, such as a flip chip bonding (FCB) structure in which an electrode pad of the SAW chip is connected to a terminal of the package with metallic bumps, a CSP (Chip Size Package) structure in which the SAW chip is flip-chip-bonded onto a wiring board and the vicinity of the SAW chip is sealed with resin, a WLCSP (Wafer Level Chip Size Package) structure in which a metal film or a resin layer is provided on the SAW chip so that a package or a wiring substrate is unnecessary, and an AQP (All Quartz Package) structure in which a quartz device is inserted between quartz or glass substrates so as to seal the laminated layer. In the AQP structure, since the quartz device is simply inserted between quartz or glass substrates, a package is unnecessary and the structure can be made thinner. Further, if using low-fusing-point glass sealing or directly sealing, out gas due to an adhesive is reduced, thereby exhibiting excellent aging characteristics.

The entire disclosure of Japanese Patent Application No. 2005-001052, filed Jan. 6, 2005 is expressly incorporated by reference herein.

What is claimed is:

1. A surface acoustic wave device having a piezoelectric substrate and an IDT formed on the piezoelectric substrate and using an excited wave as an SH wave,
    wherein the piezoelectric substrate is a rotation Y-cut substrate made from a quartz flat substrate, where a cut angle θ of the piezoelectric substrate is a rotation angle of a crystal Z-axis when the piezoelectric substrate is rotated around a crystal X-axis, a direction in which the piezoelectric substrate is rotated from a positive Z-axis side to a positive Y-axis side is a direction in which the cut angle θ is negative, and the cut angle θ is set in the range of −65°≦θ≦−61°, and a propagation direction of a surface acoustic wave is set in the range (90°±5°) with respect to the crystal X-axis, and
    the IDT is made of Ta or an alloyed metal containing Ta as the main component.

2. A surface acoustic wave device having a piezoelectric substrate and an IDT formed on the piezoelectric substrate and using an excited wave as an SH wave,
    wherein the piezoelectric substrate is a rotation Y-cut substrate made from a quartz flat substrate, where a cut angle θ of the piezoelectric substrate is a rotation angle of a crystal Z-axis when the piezoelectric substrate is rotated around a crystal X-axis, a direction in which the piezoelectric substrate is rotated from a positive Z-axis side to a positive Y-axis side is a direction in which the cut angle θ is negative, and the cut angle θ is set in the range of −65°≦θ≦−51°, and a propagation direction of a surface acoustic wave is set in the range (90°±5°) with respect to the crystal X-axis, and an electrode thickness H/λ, standardized by a wavelength of the IDT, is set in the range of 0.01≦H/λ≦0.05 when a wavelength of an excited surface acoustic wave is set to be λ, and
    the IDT is made of Ta or an alloyed metal containing Ta as the main component,
    wherein a multiplication H/λ·mr of the electrode thickness H/λ and a metallization ratio mr is set in the range of 0.004≦H/λ·mr≦0.019, the metallization ratio mr of the electrode fingers of the IDT being represented by (electrode finger widths)/(electrode finger widths+spaces between electrode fingers), and wherein when the metallization ratio mr is set in the range of $0.004 \leq H/\lambda \cdot mr < 0.019$, the cut angle θ at which a turnover temperature is maintained substantially at room temperature decreases as the electrode thickness H/λ increases or the metallization ratio mr increases.

3. The surface acoustic wave device according to claim 1, wherein a multiplication H/λ·mr of an electrode thickness H/λ and a metallization ratio mr is set in the range of $0.004 \leq H/\lambda \cdot mr < 0.019$, when the metallization ratio mr of the electrode fingers of the IDT is represented by (electrode finger widths)/(electrode finger widths+spaces between electrode fingers).

4. A complex device using the surface acoustic wave device described in claim 1 and including an oscillation circuit or a module device.

5. A complex device using the surface acoustic wave device described in claim 2 and including an oscillation circuit or a module device.

6. A surface acoustic wave device having a piezoelectric substrate and an IDT formed on the piezoelectric substrate, the surface acoustic wave device using an SH wave as an excitation wave, the surface acoustic wave device comprising:

grating reflectors on both sides of the IDT that reflect a surface acoustic wave, wherein the piezoelectric substrate is a rotation Y-cut substrate made from a quartz flat substrate, where a cut angle θ of the piezoelectric substrate is a rotation angle of a crystal Z-axis when the piezoelectric substrate is rotated around a crystal X-axis, a direction in which the piezoelectric substrate is rotated from a positive Z-axis side to a positive Y-axis side is a direction in which the cut angle θ is negative, and the cut angle θ is set in the range of $-65° \leq \theta \leq -51°$, and a propagation direction of the surface acoustic wave is set in the range (90°±5°) with respect to the crystal X-axis, and an electrode thickness H/λ, standardized by a wavelength of the IDT, is set in the range of $0.01 \leq H/\lambda \leq 0.05$ when a wavelength of an excited surface acoustic wave is set to be λ, wherein a multiplication H/λ·mr of the electrode thickness H/λ and a metallization ratio mr is set in the range of $0.004 \leq H/\lambda \cdot mr < 0.019$, the metallization ratio mr of the electrode fingers of the IDT being represented by (electrode finger widths)/(electrode finger widths+spaces between electrode fingers), and wherein when the metalization ratio mr is set in the range of $0.004 \leq H/\lambda \cdot mr < 0.019$, the cut angle θ at which a turnover temperature is maintained substantially at room temperature decreases as the electrode thickness H/λ increases or the metallization ratio mr increases, and the IDT is made of Ta or an alloyed metal containing Ta as the main component.

7. A complex device using the surface acoustic wave device described in claim 6 and including an oscillation circuit or a module device.

* * * * *